United States Patent
Wang et al.

(10) Patent No.: US 10,989,971 B2
(45) Date of Patent: Apr. 27, 2021

(54) ARRAY SUBSTRATE AND MAINTENANCE METHOD THEREFOR, AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaoyuan Wang, Beijing (CN); Ni Yang, Beijing (CN); Wu Wang, Beijing (CN); Kui Zhang, Beijing (CN); Yan Fang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 247 days.

(21) Appl. No.: 16/320,580

(22) PCT Filed: May 15, 2018

(86) PCT No.: PCT/CN2018/086828
§ 371 (c)(1),
(2) Date: Jan. 25, 2019

(87) PCT Pub. No.: WO2018/233407
PCT Pub. Date: Dec. 27, 2018

(65) Prior Publication Data
US 2019/0243196 A1    Aug. 8, 2019

(30) Foreign Application Priority Data
Jun. 20, 2017 (CN) .......................... 201710470926.0

(51) Int. Cl.
*H01L 27/12* (2006.01)
*G02F 1/1362* (2006.01)
(Continued)

(52) U.S. Cl.
CPC ...... *G02F 1/136259* (2013.01); *G02F 1/1309* (2013.01); *G02F 1/13439* (2013.01);
(Continued)

(58) Field of Classification Search
CPC ............. G02F 1/136259; G02F 1/1309; G02F 1/136209; G02F 1/136286; G02F 1/13439;
(Continued)

(56) References Cited

U.S. PATENT DOCUMENTS

2004/0169781 A1* 9/2004 Lee ................... G02F 1/136259
349/54
2014/0293171 A1* 10/2014 Jun ........................ G02B 30/25
349/15
2015/0185513 A1 7/2015 Wu et al.

FOREIGN PATENT DOCUMENTS

CN          1527258 A       9/2004
CN        101201469 A       6/2008
(Continued)

OTHER PUBLICATIONS

International Search Report and Written Opinion dated Jul. 30, 2018; PCT/CN2018/086828.

*Primary Examiner* — Selim U Ahmed

(57) ABSTRACT

An array substrate and a maintenance method therefor, and a display apparatus are provided. The array substrate includes: a plurality of data signal lines, wherein each of the data signal lines includes a plurality of data signal line sub-segments corresponding to a plurality of pixel units on a one-to-one basis, and each of the pixel units includes a
(Continued)

light-shielding metal strip, wherein an orthographic projection of an input end of the data signal line sub-segment on a base substrate and an orthographic projection of the light-shielding metal strip on the base substrate have a first overlapping region used as a first maintenance site, and an orthographic projection of an output end of the data signal line sub-segment on the base substrate and an orthographic projection of the light-shielding metal strip on the base substrate have a second overlapping region used as a second maintenance site.

12 Claims, 3 Drawing Sheets

(51) Int. Cl.
*G02F 1/1343* (2006.01)
*G02F 1/13* (2006.01)

(52) U.S. Cl.
CPC .. *G02F 1/136209* (2013.01); *G02F 1/136286* (2013.01); *H01L 27/124* (2013.01); *H01L 27/1259* (2013.01); *G02F 1/136263* (2021.01)

(58) Field of Classification Search
CPC ....... G02F 2001/136263; H01L 27/124; H01L 27/1259
See application file for complete search history.

(56) References Cited

FOREIGN PATENT DOCUMENTS

| | | |
|---|---|---|
| CN | 103278987 A | 9/2013 |
| CN | 106773427 A | 5/2017 |
| CN | 107065369 A | 8/2017 |
| JP | 4491205 B2 | 6/2010 |
| TW | 200416429 A | 9/2004 |

* cited by examiner

ARRAY SUBSTRATE AND MAINTENANCE METHOD THEREFOR, AND DISPLAY APPARATUS

The present application claims priority of China Patent application No. 201710470926.0 filed on Jun. 20, 2017, the content of which is incorporated in its entirety as portion of the present application by reference herein.

TECHNICAL FIELD

Embodiments of the present disclosure relate to an array substrate, a maintenance method thereof, and a display device.

BACKGROUND

At present, in a liquid crystal display device of an In-Plane Switching (IPS) mode, in order to reduce storage capacitance of an array substrate and avoid light leakage phenomenon of the array substrate upon being curved, a gate driver on array (GOA) technology and a color filter on array (COA) technology are adopted to manufacture the array substrate.

SUMMARY

An embodiment of the present disclosure provides an array substrate, the array substrate includes a plurality of data signal lines, each of the plurality of data signal lines includes a plurality of data signal line sub-segments being in one-to-one correspondence with a plurality of pixel units, each of the plurality of pixel units includes a light shielding metal strip between a base substrate and a corresponding data signal line sub-segment, and a common electrode disposed on a side of the corresponding data signal line sub-segment away from the light shielding metal strip, the common electrode has a light shielding property, the common electrode is insulated with the corresponding data signal line sub-segment, the corresponding data signal line sub-segment is insulated with the light shielding metal strip. An orthographic projection of an input terminal of the corresponding data signal line sub-segment on the base substrate and an orthographic projection of the light shielding metal strip on the base substrate have a first overlapping region serving as a first maintenance point, an orthographic projection of an output terminal of the corresponding data signal line sub-segment on the base substrate and an orthographic projection of the light shielding metal strip on the base substrate have a second overlapping region serving as a second maintenance point.

Another embodiment of present embodiment provides a display device, the display device includes the array substrate provided by the abovementioned embodiment.

Based on the abovementioned array substrate, another embodiment of the present disclosure provides a maintenance method of an array substrate, used to maintain the abovementioned array substrate, the maintenance method of the array substrate includes the following steps: step 10: determining a broken one of the plurality of data signal line sub-segments; step 20: in the first overlapping region corresponding to the broken one of the plurality of data signal line sub-segments, connecting the input terminal of the broken one of the plurality of data signal line sub-segments to the light shielding metal strip; in the second overlapping region corresponding to the broken one of the plurality of data signal line sub-segments, connecting the output terminal of the broken one of the plurality of data signal line sub-segments to the light shielding metal strip.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
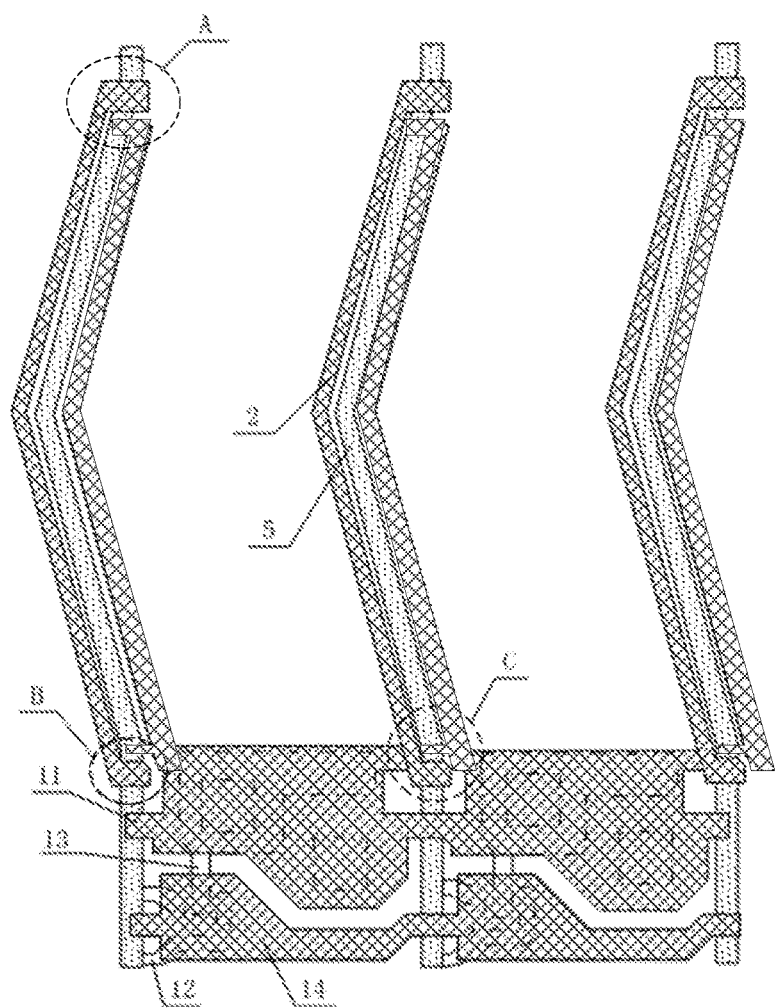
FIG. 1 is a schematic structural diagram of an array substrate provided by an embodiment of the present disclosure.
Figure 2:
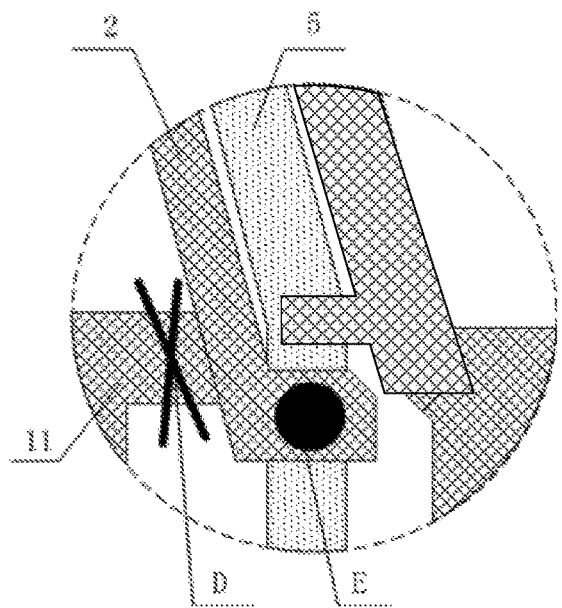
FIG. 2 is an enlarged diagram of a region C of an array substrate provided by an embodiment of the present disclosure.
Figure 3:
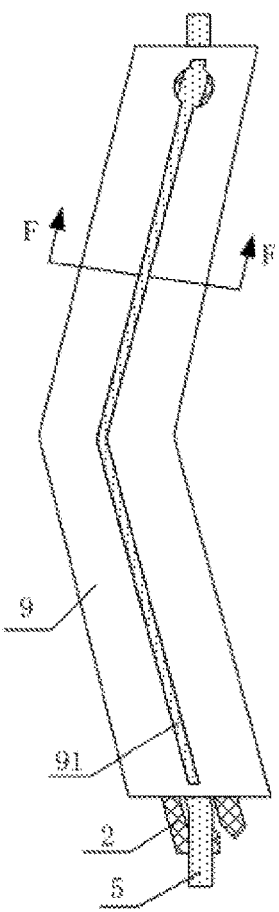
FIG. 3 is a schematic diagram of a common electrode of an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Generally, in the abovementioned array substrate manufactured by the GOA technology and the COA technology, a common electrode and a pixel electrode are disposed in the same layer, which can reduce the storage capacitance of the array substrate; and a light shielding metal strip and a gate electrode are disposed in the same layer on the base substrate. The data signal line is disposed on a side of the light shielding metal strip away from the base substrate, the common electrode is disposed on a side of the data signal line away from the light shielding metal strip, and the common electrode is made of an opaque metal material such as molybdenum (Mo) or an alloy thereof. The overlapping of different layers of the common electrode, the data signal line and the light shielding metal strip can avoid the light leakage of the array substrate upon being curved.

However, during a detection process after the array substrate is manufactured, if it is detected that there is a broken circuit among the data signal lines, because a lower surface of the data signal lines facing the base substrate is generally provided with a semiconductor layer, and an upper surface of the data signal lines away from the base substrate is shielded by the common electrode which is opaque, it is hard for an engineer to observe a position of a broken point of the data signal line, so that it is relatively difficult for the engineers to maintain the broken point of the data signal line.

Embodiments of the present disclosure provide an array substrate, a maintenance method thereof, and a display device, which makes it convenient for an engineer to maintain a broken data signal line in the array substrate.

Referring to FIGS. 1-4, the array substrate provided by an embodiment of the present disclosure includes a plurality of data signal lines, each of the plurality of data signal lines includes a plurality of data signal line sub-segments 5 being in one-to-one correspondence with a plurality of pixel units, each of the plurality of pixel units includes a light shielding metal strip 2 between a base substrate 1 and a corresponding data signal line sub-segment 5, and a common electrode 9 disposed on a side of the corresponding data signal line sub-segment 5 away from the light shielding metal strip 2, the common electrode 9 has a light shielding property, the common electrode 9 is insulated with the corresponding data signal line sub-segment 5, and the corresponding data signal line sub-segment 5 is insulated with the light shielding metal strip 2. An orthographic projection of an input terminal of the corresponding data signal line sub-segment 5 on the base substrate 1 and an orthographic projection of the light shielding metal strip 2 on the base substrate 1 have a first overlapping region A serving as a first maintenance point, an orthographic projection of an output terminal of the corresponding data signal line sub-segment 5 on the base substrate 1 and an orthographic projection of the light shielding metal strip 2 on the base substrate 1 have a second overlapping region B serving as a second maintenance point.

The array substrate provided by the embodiment of the present disclosure has the following favorable effects: in the array substrate provided by the embodiment of the present disclosure, the orthographic projection of the input terminal of the corresponding data signal line sub-segment on the base substrate and the orthographic projection of the light shielding metal strip on the base substrate have the first overlapping region, and the orthographic projection of the output terminal of the corresponding data signal line sub-segment on the base substrate and the orthographic projection of the light shielding metal strip on the base substrate have the second overlapping region; upon there being a broken data signal line in the array substrate, it is easy to determine which one of the plurality of data signal lines is the broken data signal line, and further determine a pixel unit corresponding to a broken region of the broken data signal line by using a known detection technology, i.e., determining a broken data signal line sub-segment. In this way, the first overlapping region corresponding to the broken data signal line sub-segment can serve as a first maintenance point, and the second overlapping region corresponding to the broken data signal line sub-segment can serve as a second maintenance point, without precisely finding a position of a broken point of the broken data signal line sub-segment and using the position of the broken point as a maintenance point. Then, the input terminal of the broken data signal line sub-segment and the light shielding metal strip can be correspondingly connected at the first maintenance point, and the output terminal of the broken data signal line sub-segment and the light shielding metal strip can be correspondingly connected at the second maintenance point, so as to allow the light shielding metal strip to replace the broken data signal line sub-segment to transmit a signal, which makes it convenient for the engineers to accomplish the maintenance of the broken data signal line sub-segment in the array substrate, and makes it favorable to improve the maintenance efficiency of the broken data signal line in the array substrate, so as to further improve the product yield of the array substrate.

In the array substrate provided by the embodiment of the present disclosure, the plurality of data signal lines may be in a parallel arrangement along a row direction or a column direction, and each of the plurality of data signal lines are divided into a plurality of data signal line sub-segments 5 being in one-to-one correspondence with the plurality of pixel units. In the array substrate provided by the embodiment of the present disclosure, for each of the plurality of pixel units, a light shielding metal strip 2 is formed on the base substrate 1, a data signal line sub-segment 5 is formed on a side of the light shielding metal strip 2 away from the base substrate 1, such that the input terminal and the output terminal of the data signal line sub-segment 5 are respectively overlapped with the light shielding metal strip 2, i.e., an orthographic projection of the input terminal of the data signal line sub-segment 5 on the base substrate 1 and an orthographic projection of the light shielding metal strip 2 on the base substrate 1 have a first overlapping region A, an orthographic projection of the output terminal of the data signal line sub-segment 5 on the base substrate 1 and an orthographic projection of the light shielding metal strip 2 on the base substrate 1 have a second overlapping region B; then a common electrode 9 having a light shielding property is formed on a side of the data signal line sub-segment 5 away from the base substrate 1, and the common electrode 9 is generally made of a metal material having a light shielding property such as molybdenum (Mo), molybdenum nickel alloy or molybdenum titanium alloy.

Besides, in the abovementioned embodiment, the data signal line sub-segment 5 is insulated with the light shielding metal strip 2, and an insulating layer 3 is formed between the data signal line sub-segment 5 and the light shielding metal strip 2, and a semiconductor layer 4 is further provided between the data signal line sub-segment 5 and the insulating layer 3. The common electrode 9 and the data signal line sub-segment 5 is insulated, and a passivation layer 6, a color filter layer 7 and a planarization layer 8, etc. can be sequentially provided between the common electrode 9 and the data signal line sub-segment 5 in a bottom-up direction. Besides, upon the abovementioned array substrate being cell-assembled with a color filter substrate 10 to form a liquid crystal display panel, a side of the color filter substrate 10 facing the array substrate is further provided with a black matrix and a spacer, etc.

In a case where there is a broken data signal line in the array substrate provided by the embodiment of the present disclosure, it is easy to determine which one of the plurality of data signal lines is the broken data signal line, and further determine a pixel unit corresponding to a broken region of the broken data signal line by using a known detection technology, i.e., determining a broken data signal line sub-segment 5. In this way, the first overlapping region A corresponding to the broken data signal line sub-segment 5 can serve as a first maintenance point, and the second overlapping region B corresponding to the broken data signal line sub-segment 5 can serve as a second maintenance point, without precisely finding a position of a broken point of the broken data signal line sub-segment 5 and using the position of the broken point as a maintenance point. Then, the input terminal of the broken data signal line sub-segment 5 and the light shielding metal strip 2 can be correspondingly connected at the first maintenance point A, and the output terminal of the broken data signal line sub-segment 5 and the light shielding metal strip 2 can be correspondingly connected at the second maintenance point B, so as to allow the light shielding metal strip 2 to replace the broken data signal line sub-segment 5 to transmit a signal, which makes it convenient for the engineers to accomplish the maintenance of the broken data signal line sub-segment 5 in the array substrate, and makes it favorable to improve the maintenance efficiency of the broken data signal line sub-segment 5 in the array substrate, so as to further improve the product yield of the array substrate.

It should be noted that, in the abovementioned embodiment, each of the plurality of pixel units is correspondingly provided with a thin film transistor, the input terminal of the data signal line sub-segment 5 refers to one terminal thereof used for receiving an external control signal, and the output terminal of the data signal line sub-segment 5 refers to one terminal thereof used for outputting the control signal to the thin film transistor. For example, referring to FIG. 1, the thin film transistor generally includes a gate electrode 14, a drain electrode 13, and a source electrode 12, etc. The output terminal of the data signal line sub-segment 5 is generally connected with the source electrode 12 of the thin film transistor, so to output the control signal to the thin film transistor.

It can be understood that, an overlapping area of the input terminal of the data signal line sub-segment 5 and the light shielding metal strip 2, and an overlapping area of and the output terminal of the data signal line sub-segment 5 and the light shielding metal strip 2 can be determined according to the specific size of the data signal line sub-segment 5 and the light shielding metal strip 2, as long as the broken data signal line sub-segment 5 can be maintained, and the input terminal and the output terminal of the data signal line sub-segment 5 can be corresponding connected with the light shielding metal strip 2.

Figure 4:
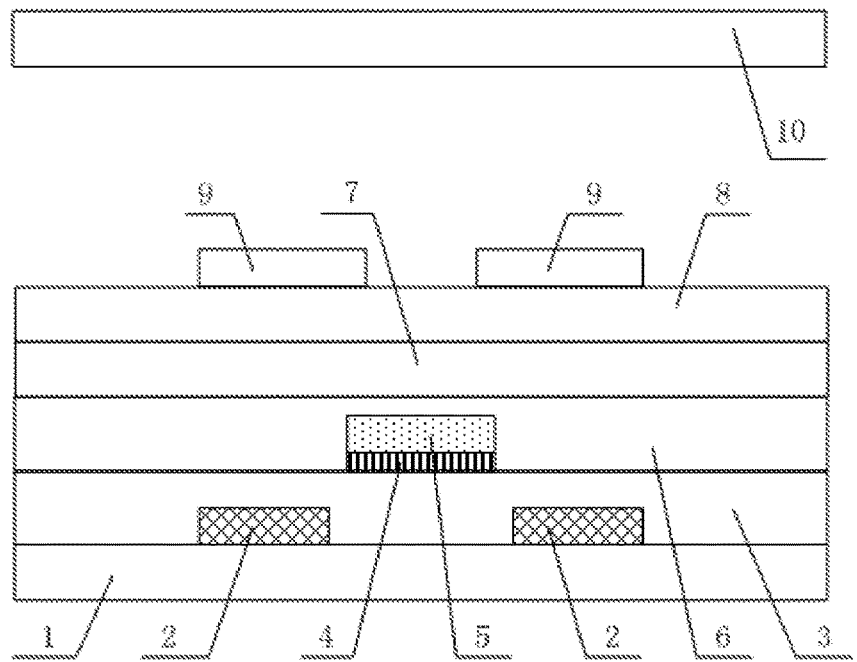
FIG. 4 is a schematic sectional diagram along F-F direction of an array substrate provided by an embodiment of the present disclosure.

In order to improve the backup rate of the light shielding metal strip 2, referring to FIG. 1 and FIG. 4, in the abovementioned array substrate, one data signal line sub-segment 5 is correspondingly provided with two light shielding metal strips 2. Generally, along a direction parallel to an extending direction of the data signal line sub-segment 5, the two light shielding metal strips 2 are respectively disposed at both sides of the data signal line sub-segment 5, besides, portions of each of the two light shielding metal strips 2 corresponding to the input terminal and output terminal of the data signal line are respectively bended toward the data signal line sub-segment 5, so that the input terminal and the output terminal of the data signal line sub-segment 5 are respectively overlapped with each of the two light shielding metal strips 2. After one of the two light shielding metal strips 2 is selected to be correspondingly connected with the input terminal and the output terminal of the data signal line sub-segment 5, if the light shielding metal strip 2 also have a broken circuit problem, then the other light shielding metal strip 2 can be a backup, which can improve the backup rate of the light shielding metal strip 2, and is favorable for improving the product yield of the array substrate.

In order to prevent the uncontrollable potential formed by accumulated free charges on the light shielding metal strip 2 from affecting the pixel voltage of the array substrate, in the array substrate provided by the embodiment of the present disclosure, a conductive metal such as aluminum and copper is generally used to form the light shielding metal strips 2 and a common metal line 11 in the same layer on the base substrate 1, then, in the two light shielding metal strips 2, at least one light shielding metal strip 2 is connected with the common metal line 11 which is disposed in the same layer. In this way, because the common metal line 11 and the common electrode 9 have the same electric potential, the light shielding metal strip 2 connected with the common metal line 11 also has the same electric potential with the common electrode 9, and the electric potential of the light shielding strip 2 can be effectively controlled.

In a case where only one light shielding metal strip 2 of the two light shielding metal strips 2 is connected with the common metal line 11, upon a data signal line sub-segment 5 being broken, the input terminal and the output terminal of the data signal line sub-segment 5 are respectively connected with the light shielding metal strip 2 which is not connected with the common metal line 11, in this case, the other light shielding metal strip 2 is connected with the common metal line 11 and keeps the same electric potential with the common electrode 9, which can effectively prevent the accumulated free charges on the light shielding metal strip 2 from forming the uncontrollable electric potential, and avoid the voltage jump of the pixel voltage caused by a relatively high electric potential or relatively low electric potential of the light shielding metal strip 2.

In a case where both of the light shielding metal strips 2 are connected with the common metal line 11, upon a data signal line sub-segment 5 being broken, it is needed to firstly cut off a connection between one of the light shielding metal strips 2 and the common metal line 11, and then the input terminal and the output terminal of the data signal line sub-segment 5 are respectively connected with the light shielding metal strip 2 which is disconnected from the common metal line 11. For example, referring to FIG. 2, a region D is a cut-off point where the connection between the light shielding metal strip 2 and the common metal line 11 is cut off, a region E is a connection point to connect the output terminal of the data signal line sub-segment 5 and the light shielding metal strip 2 which is disconnected from the common metal line. In this case, the other light shielding metal strip 2 is connected with the common metal line 11 and keeps the same electric potential with the common electrode 9, which can effectively prevent the accumulated free charges on the light shielding metal strip 2 from forming the uncontrollable electric potential, and avoid the voltage jump of the pixel voltage caused by a relatively high electric potential or relatively low electric potential of the light shielding metal strip 2.

It should be noted that, in the abovementioned embodiment, the common electrode 9 has a light shielding property, and the common electrode 9 is located on a side of the data signal line sub-segment 5 away from the light shielding metal strip 2. In order to facilitate the engineers to track a position of a broken point of the data signal line sub-segment in the array substrate, referring to FIG. 3 and FIG. 4, a slit 91 extending in a direction parallel to an extending direction of the data signal line sub-segment 5 can be provided in the common electrode 9, so as to utilize the slit 91 to observe the position of the broken point of the data signal line sub-segment 5. In this case, for the broken data signal line sub-segment 5, if the engineers use a microscope, the position of the broken point of the data signal line sub-segment 5 can be precisely observed through the slit 91, and the engineers can directly maintain the data signal line sub-segment 5 at the broken point. As seen, the array substrate provided by the present embodiment increases a solution for the engineers to maintain the broken data signal line sub-segment 5, which facilitates the engineers to select an optimized maintenance solution to the broken data signal line sub-segment 5, and makes it favorable to improve the maintenance efficiency of the broken data signal line in the array substrate.

It can be understood that, the common electrode 9 is used to prevent a light leakage phenomenon upon the array substrate being bended, in a case where the common electrode 9 is provided with the slit 91, it needs to ensure that the existence of the slit 91 does not affect the light shielding effect of the common electrode 9. Besides, it is needed to dispose the slit 91 in a region of the common electrode 9 corresponding to the data signal line sub-segment 5, such that the engineers can clearly observe the data signal line sub-segment 5 through the slit 91 under a microscope.

In order to facilitate the engineers to recognize the first overlapping region A serving as the first maintenance point, and the second overlapping region B serving as the second maintenance point, and facilitate the engineers to maintain the data signal line sub-segment 5 upon being broken, on the basis of the abovementioned embodiment, the common electrode 9 is provided with a first maintenance hole in a region corresponding to the first overlapping region A, the common electrode is provided with a second maintenance hole in a region corresponding to the second overlapping region B. In this way, the first maintenance hole can represent the first maintenance point, and the second maintenance hole can represent the second maintenance point, after determining the broken data signal line sub-segment 5, the broken data signal line sub-segment 5 can be maintained directly through the first maintenance hole and the second maintenance hole, so as to further improve maintenance convenience of the broken data signal line in the array substrate.

Figure 5:
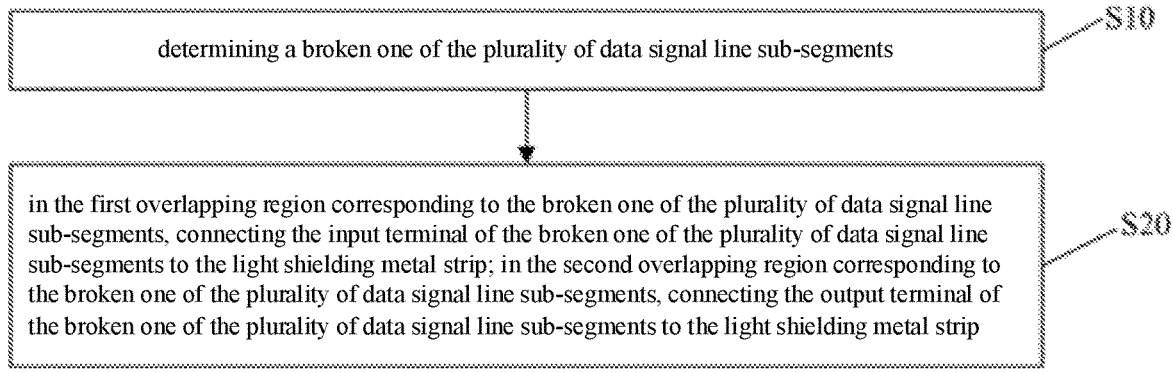
FIG. 5 is a first flow chart of a maintenance method of an array substrate provided by an embodiment of the present disclosure.

An embodiment of the present disclosure provides a maintenance method of an array substrate, used to maintain the array substrate provided by the abovementioned embodiment, referring to FIG. 5, the maintenance method includes the following steps:

S10: determining a broken one of the plurality of data signal line sub-segments.

In specific implementation, a known detection technology such as an attenuation detection of data signal is adopted to firstly determine that which one of the plurality of data signal lines is a broken data signal line, and then further determine a pixel unit corresponding to a broken region of broken data signal line, i.e., determine the broken one of the plurality of data signal line sub-segments.

S20: in the first overlapping region corresponding to the broken one of the plurality of data signal line sub-segments, connecting the input terminal of the broken one of the plurality of data signal line sub-segments to the light shielding metal strip; in the second overlapping region corresponding to the broken one of the plurality of data signal line sub-segments, connecting the output terminal of the broken one of the plurality of data signal line sub-segments to the light shielding metal strip.

The maintenance method of the array substrate provided by the embodiment of the present disclosure can achieve favorable effects the same as the favorable effects which can be achieved by the array substrate provided by the abovementioned array substrate, and the repeated portions are omitted.

Figure 6:
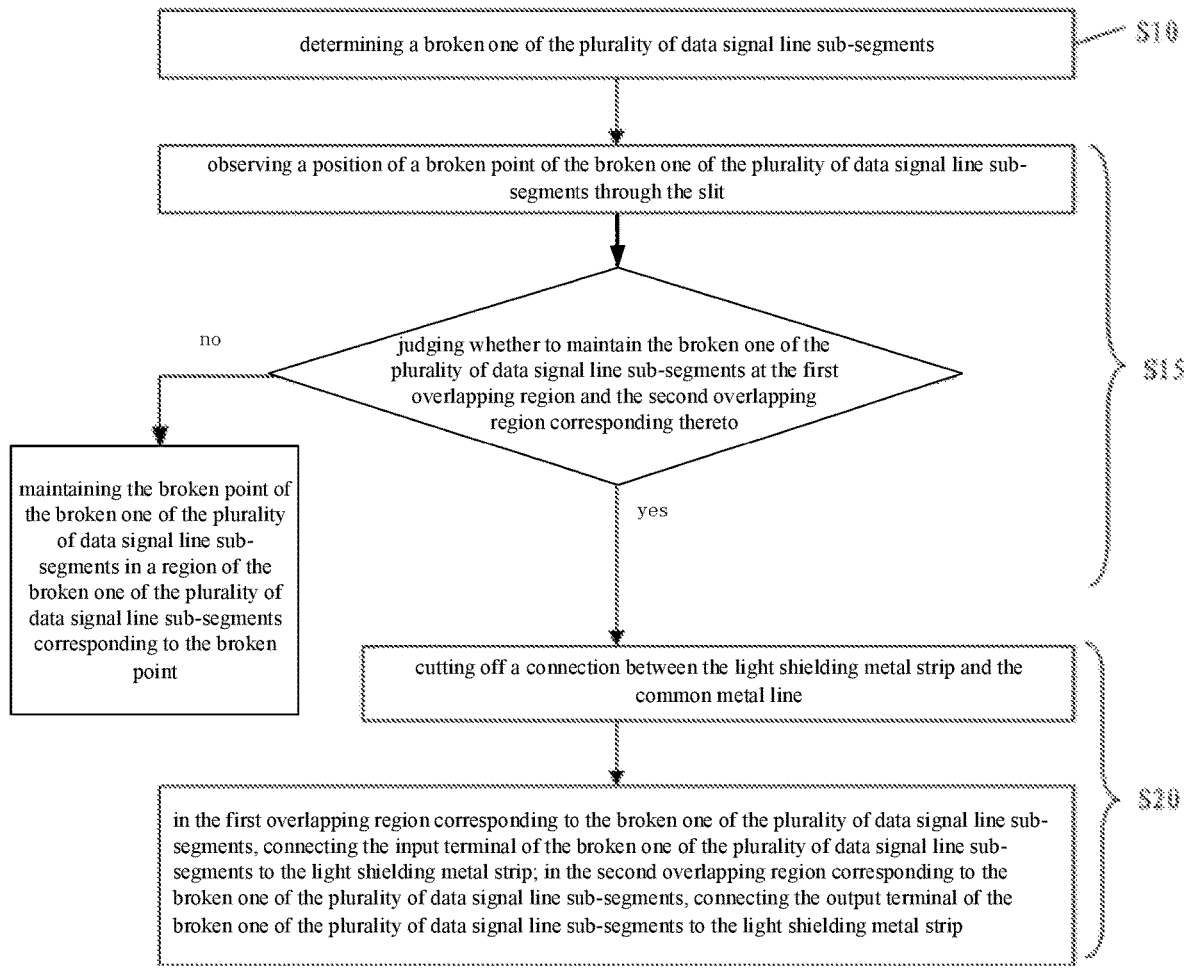
FIG. 6 is a second flow chart of a maintenance method of an array substrate provided by an embodiment of the present disclosure.

It should be noted that, in the array substrate provided by the present embodiment, in a case where the light shielding metal strip and the common metal line are connected, referring to FIG. 6, in the maintenance method of the array substrate provided by the abovementioned embodiment, before correspondingly connecting the input terminal and the output terminal of the broken one of the plurality of data signal line sub-segments to the light shielding metal strip, S20 further includes: cutting off a connection between the light shielding metal strip and the common metal line.

For example, in a case where there are two light shielding metal strips, and both of the light shielding metal strips are connected with the common metal line, upon a data signal line sub-segment being broken, it is needed to firstly cut off a connection between one of the light shielding metal strips and the common metal line, and then the input terminal and the output terminal of the data signal line sub-segment are respectively connected with the light shielding metal strip which is cut off with the common metal line.

It should be noted that, in the array substrate provided by the abovementioned embodiment, the common electrode is provided with a first maintenance hole in a region corresponding to the first overlapping region, and the common electrode is provided with a second maintenance hole in a region corresponding to the second overlapping region. In this way, upon the data signal line sub-segment and the light shielding metal strip being correspondingly connected, the maintenance method of the array substrate provided by the abovementioned embodiment can make it convenient for the engineers to utilize the first maintenance hole to recognize the first overlapping region serving as the first maintenance point, and utilize the second maintenance hole to recognize the second overlapping region serving as the second maintenance point, then to correspondingly connect the input terminal of the broken data signal line sub-segment to the light shielding metal strip through the first maintenance hole and correspondingly connect the output terminal of the broken data signal line sub-segment to the light shielding metal strip through the second maintenance hole, so as to improve the maintenance convenience of the broken data signal line in the array substrate.

Besides, the common electrode can be prevented from covering the first maintenance point and the second maintenance point by disposing the first maintenance hole and the second maintenance hole. Thus, upon the broken data signal line sub-segment being maintained at the first maintenance point and the second maintenance point, a problem that the common electrode are connected with the data signal line sub-segment and the light shielding metal strip caused by a case that the common electrode covers the first maintenance point and the second maintenance point can be avoided, such that the broken data signal line sub-segment can be well maintained, which makes it favorable to improve the maintenance precision of the broken data signal line in the array substrate, so as to further the product yield of the array substrate.

In order to facilitate the engineers to select an optimized maintenance solution to the broken data signal line sub-segment in the array substrate, and improve the maintenance efficiency of the broken data signal line in the array substrate, in the array substrate provided by the present embodiment, a slit extending in a direction parallel to an extending direction of the data signal line sub-segment can be provided in the common electrode; correspondingly, referring to FIG. 6, between S10 and S20, the maintenance method of the array substrate further includes:

S15: observing a position of a broken point of the broken one of the plurality of data signal line sub-segments through the slit, judging whether to maintain the broken one of the plurality of data signal line sub-segments at the first overlapping region and the second overlapping region corresponding thereto; if yes, executing S20; if no, maintaining the broken point of the broken one of the plurality of data signal line sub-segments in a region of the broken one of the plurality of data signal line sub-segments corresponding to the broken point.

As seen, the array substrate provided by the present embodiment increases a solution for the engineers to maintain the broken data signal line sub-segment, if the position of the broken point of the broken one of the plurality of data signal line sub-segments can be precisely observed through the slit, such that the engineers can directly maintain the broken one of the plurality of data signal line sub-segments at the position of the broken point, which makes it convenient for the engineers to select an optimized maintenance solution to the broken data signal line sub-segment, and makes it favorable to improve the maintenance efficiency of the broken data signal line in the array substrate.

It can be understood that, in the abovementioned embodiment, the connection between the light shielding metal strip and the common metal line are cut off through a laser cutting method; the input terminal of the broken one of the plurality of data signal line sub-segments and the light shielding metal strip are connected through a laser welding method, and the output terminal of the broken one of the plurality of data signal line sub-segments and the light shielding metal strip are connected through a laser welding method. In this way, the connection between the light shielding metal strip and the common metal line can be efficiently and precisely cut off through a laser cutting method, and the data signal line sub-segment and the light shielding metal strip can be efficiently and precisely connected through a laser welding method, which is favorable for improving the maintenance efficiency and maintenance precision of the braking data signal line.

An embodiment of the present disclosure further provides a display device, the display device includes the array substrate provided by the abovementioned embodiment. The array substrate in the display device has the same advantages with the array substrate in the abovementioned embodiments, and the repeated portions are omitted herein.

The display device provided by the abovementioned embodiment can be a product or component having a display function, such as: cellphone, flat plate computer, television, display, notebook computer, digital frame, and navigator.

The foregoing is only exemplary embodiments of the present disclosure, but the scope of protection of the present disclosure is not limited thereto, and the scope of protection of the present disclosure is subject to the scope of protection of the claims.

What is claimed is:

1. An array substrate, comprising a plurality of data signal lines, wherein each of the plurality of data signal lines comprises a plurality of data signal line sub-segments being in one-to-one correspondence with a plurality of pixel units, each of the plurality of pixel units comprises a light shielding metal strip between a base substrate and a corresponding data signal line sub-segment, and the corresponding data signal line sub-segment is insulated with the light shielding metal strip, an orthographic projection of an input terminal of the corresponding data signal line sub-segment on the base substrate and an orthographic projection of the light shielding metal strip on the base substrate have a first overlapping region serving as a first maintenance point, an orthographic projection of an output terminal of the corresponding data signal line sub-segment on the base substrate and the orthographic projection of the light shielding metal strip on the base substrate have a second overlapping region serving as a second maintenance point;

each of the plurality of data signal lines further comprises a common electrode disposed on a side of the corresponding data signal line sub-segment away from the light shielding metal strip, the common electrode has a light shielding property, and the common electrode is insulated with the corresponding data signal line sub-segment; and the common electrode is provided with a slit extending in a direction parallel to the plurality of data signal line sub-segments; the slit is configured to observe position of a broken point of the plurality of data signal line sub-segments.

2. The array substrate according to claim 1, wherein one of the plurality of data signal line sub-segments corresponds two light shielding metal strips, the two light shielding metal strips are respectively disposed at both sides of one data signal line sub-segment, portions of each light shielding metal strip corresponding to the input terminal and output terminal of the data signal line sub-segment are respectively bended toward the data signal line sub-segment, so that the input terminal and the output terminal of the data signal line sub-segment are respectively overlapped with the two light shielding metal strips in a direction perpendicular to the base substrate.

3. A display device, comprising the array substrate according to claim 1, wherein the display device further comprises a color filter substrate opposite to the array substrate.

4. A maintenance method of an array substrate, for maintaining the array substrate according to claim 1, the maintenance method comprises:

step 10: determining a broken one of the plurality of data signal line sub-segments;

step 20: in the first overlapping region corresponding to the broken one of the plurality of data signal line sub-segments, connecting the input terminal of the broken one of the plurality of data signal line sub-segments to the light shielding metal strip;

in the second overlapping region corresponding to the broken one of the plurality of data signal line sub-segments, connecting the output terminal of the broken one of the plurality of data signal line sub-segments to the light shielding metal strip, wherein, between step 10 and step 20, the maintenance method of the array substrate further comprises:

step 15: observing a position of a broken point of the broken one of the plurality of data signal line sub-segments through the slit, judging whether to maintain the broken one of the plurality of data signal line sub-segments at the first overlapping region and the second overlapping region corresponding thereto;

if yes, executing step 20;

if no, maintaining the broken point of the broken one of the plurality of data signal line sub-segments in a region of the broken one of the plurality of data signal line sub-segments corresponding to the broken point.

5. The maintenance method of the array substrate according to claim 4, wherein the light shielding metal strip is connected with a common metal line which is disposed in a same layer as the light shielding metal strip;

before connecting the input terminal and the output terminal of the broken one of the plurality of data signal line sub-segments to the light shielding metal strip, step 20 further comprises:

cutting off a connection between the light shielding metal strip and the common metal line.

6. The maintenance method of the array substrate according to claim 4, wherein a region of the common electrode corresponding to the first overlapping region is provided with a first maintenance hole; and a region of the common electrode corresponding to the second overlapping region is provided with a second maintenance hole;
connecting the input terminal of the broken one of the plurality of data signal line sub-segments to the light shielding metal strip through the first maintenance hole; and
connecting the output terminal of the broken one of the plurality of data signal line sub-segments to the light shielding metal strip through the second maintenance hole.

7. The maintenance method of the array substrate according to claim 4, wherein a connection between the input terminal of the broken one of the plurality of data signal line sub-segments and the light shielding metal strip, and a connection between the output terminal of the broken one of the plurality of data signal line sub-segments and the light shielding metal strip are formed by a laser welding method.

8. The array substrate according to claim 1, wherein a region of the common electrode corresponding to the first overlapping region is provided with a first maintenance hole; and
a region of the common electrode corresponding to the second overlapping region is provided with a second maintenance hole.

9. The array substrate according to claim 2, wherein in the two light shielding metal strips, at least one of the two light shielding metal strips is connected with a common metal line which is disposed in a same layer as the two light shielding metal strips.

10. A maintenance method of an array substrate, for maintaining the array substrate according to claim 1, the maintenance method comprises:
step 10: determining a broken one of the plurality of data signal line sub-segments;
step 20: in the first overlapping region corresponding to the broken one of the plurality of data signal line sub-segments, connecting the input terminal of the broken one of the plurality of data signal line sub-segments to the light shielding metal strip;
in the second overlapping region corresponding to the broken one of the plurality of data signal line sub-segments, connecting the output terminal of the broken one of the plurality of data signal line sub-segments to the light shielding metal strip,
wherein a region of the common electrode corresponding to the first overlapping region is provided with a first maintenance hole; and a region of the common electrode corresponding to the second overlapping region is provided with a second maintenance hole;
connecting the input terminal of the broken one of the plurality of data signal line sub-segments to the light shielding metal strip through the first maintenance hole; and
connecting the output terminal of the broken one of the plurality of data signal line sub-segments to the light shielding metal strip through the second maintenance hole.

11. A maintenance method of an array substrate, for maintaining the array substrate according to claim 1, the maintenance method comprises:
step 10: determining a broken one of the plurality of data signal line sub-segments;
step 20: in the first overlapping region corresponding to the broken one of the plurality of data signal line sub-segments, connecting the input terminal of the broken one of the plurality of data signal line sub-segments to the light shielding metal strip;
in the second overlapping region corresponding to the broken one of the plurality of data signal line sub-segments, connecting the output terminal of the broken one of the plurality of data signal line sub-segments to the light shielding metal strip,
wherein the light shielding metal strip is connected with a common metal line which is disposed in a same layer as the light shielding metal strip;
before connecting the input terminal and the output terminal of the broken one of the plurality of data signal line sub-segments to the light shielding metal strip, step 20 further comprises:
cutting off a connection between the light shielding metal strip and the common metal line.

12. An array substrate, comprising a plurality of data signal lines, wherein each of the plurality of data signal lines comprises a plurality of data signal line sub-segments being in one-to-one correspondence with a plurality of pixel units, each of the plurality of pixel units comprises a light shielding metal strip between a base substrate and a corresponding data signal line sub-segment, and the corresponding data signal line sub-segment is insulated with the light shielding metal strip,
an orthographic projection of an input terminal of the corresponding data signal line sub-segment on the base substrate and an orthographic projection of the light shielding metal strip on the base substrate have a first overlapping region serving as a first maintenance point, an orthographic projection of an output terminal of the corresponding data signal line sub-segment on the base substrate and the orthographic projection of the light shielding metal strip on the base substrate have a second overlapping region serving as a second maintenance point;
each of the plurality of data signal lines further comprises a common electrode disposed on a side of the corresponding data signal line sub-segment away from the light shielding metal strip, the common electrode has a light shielding property, and the common electrode is insulated with the corresponding data signal line sub-segment;
a region of the common electrode corresponding to the first overlapping region is provided with a first maintenance hole; and
a region of the common electrode corresponding to the second overlapping region is provided with a second maintenance hole.

* * * * *